(12) United States Patent
Chung et al.

(10) Patent No.: US 10,756,267 B2
(45) Date of Patent: Aug. 25, 2020

(54) NONVOLATILE MEMORY COMPRISING VARIABLE RESISTANCE TRANSISTORS AND METHOD FOR OPERATING THE SAME

(71) Applicant: NATIONAL CHIAO TUNG UNIVERSITY, Hsinchu (TW)

(72) Inventors: Steve S. Chung, Hsinchu (TW); E-Ray Hsieh, Kaohsiung (TW)

(73) Assignee: NATIONAL CHIAO TUNG UNIVERSITY, Hsinchu (TW)

(*) Notice: Subject to any disclaimer, the term of this patent is extended or adjusted under 35 U.S.C. 154(b) by 0 days.

(21) Appl. No.: 15/950,193

(22) Filed: Apr. 11, 2018

(65) Prior Publication Data

US 2018/0294406 A1    Oct. 11, 2018

Related U.S. Application Data

(60) Provisional application No. 62/484,390, filed on Apr. 11, 2017.

(51) Int. Cl.
*G11C 13/00* (2006.01)
*H01L 45/00* (2006.01)
(Continued)

(52) U.S. Cl.
CPC .......... *H01L 45/12* (2013.01); *G11C 11/5685* (2013.01); *G11C 13/003* (2013.01);
(Continued)

(58) Field of Classification Search
CPC . G11C 2213/75; G11C 13/00; G11C 13/0002; G11C 13/00026; G11C 13/003; H01L 45/04; H01L 27/24
(Continued)

(56) References Cited

U.S. PATENT DOCUMENTS 8,377,789 B2   2/2013  Meijer et al.
8,559,207 B2  10/2013  Kim et al.
(Continued)

FOREIGN PATENT DOCUMENTS

EP      1959454 A2    8/2008

OTHER PUBLICATIONS

Y. X. Liu et al., "Experimental study of tri-gate SOI-FinFET flash memory," 2012 IEEE.
(Continued)

*Primary Examiner* — Alfredo Bermudez Lozada
(74) *Attorney, Agent, or Firm* — CKC & Partners Co., LLC

(57) ABSTRACT

A first memory unit includes a first bipolar-variable-resistance and a first control transistor. This first memory unit is configured to provide a function of a flash memory with first bipolar-variable-resistance transistor serving as a storage. In addition, a second bipolar-variable-resistance transistor and a second control transistor with the same structure as first memory unit can be used to serve as a second memory unit. An isolation transistor is connected between the first memory unit and the second memory unit. The isolation transistor can electrically isolate the first memory unit and the second memory unit from each other, thereby preventing sneak current from flowing between arrays among memory circuits.

15 Claims, 12 Drawing Sheets

(51) Int. Cl.
  *H01L 27/24* (2006.01)
  *G11C 11/56* (2006.01)
  *H01L 29/68* (2006.01)
(52) U.S. Cl.
  CPC ...... *G11C 13/0007* (2013.01); *G11C 13/0026* (2013.01); *G11C 13/0028* (2013.01); *H01L 27/2436* (2013.01); *H01L 27/2463* (2013.01); *H01L 29/685* (2013.01); *G11C 13/004* (2013.01); *G11C 13/0069* (2013.01); *G11C 2213/15* (2013.01); *G11C 2213/79* (2013.01)
(58) Field of Classification Search
  USPC ........................................................ 365/148
  See application file for complete search history.

(56) References Cited

U.S. PATENT DOCUMENTS

| | | | |
|---|---|---|---|
| 9,548,398 B2 | 1/2017 | Chung et al. | |
| 2008/0203378 A1* | 8/2008 | Tanaka | G11C 13/0004 257/5 |
| 2009/0290404 A1* | 11/2009 | Kaneko | G11C 11/22 365/145 |
| 2012/0025164 A1 | 2/2012 | Deweerd et al. | |
| 2013/0121056 A1* | 5/2013 | Liu | G11C 11/56 365/148 |
| 2013/0126823 A1* | 5/2013 | Satoh | H01L 45/06 257/5 |
| 2013/0148409 A1* | 6/2013 | Chung | G11C 17/18 365/148 |
| 2014/0050012 A1 | 2/2014 | Guillemenet et al. | |
| 2015/0270177 A1* | 9/2015 | Tseng | H01L 21/823857 438/216 |
| 2016/0027844 A1* | 1/2016 | Chung | H01L 45/145 365/148 |

OTHER PUBLICATIONS

S. Tsuda et al., "First demonstration of FinFET split-gate MONOS for high-speed and highly-reliable embedded flash in 16/14 nm-node and beyond," 2016 IEEE International Electron Devices Meeting (IEDM), 4 pages.

Hsin Wei Pan et al., "1Kbit FinFET Dielectric (FIND) RRAM in pure 16 nm FinFET CMOS logic process," 2015 IEEE International Electron Devices Meeting (IEDM), 4 pages.

* cited by examiner

NONVOLATILE MEMORY COMPRISING VARIABLE RESISTANCE TRANSISTORS AND METHOD FOR OPERATING THE SAME

RELATED APPLICATIONS

This application claims priority to U.S. provisional application No. 62/484,390, filed on Apr. 11, 2017, which is herein incorporated by reference.

BACKGROUND

Technical Field

The present disclosure relates to a flash memory.

Description of Related Art

The flash memory is a nonvolatile memory capable of being erased or programmed repeatedly in operation. This technique is widely used for general data storage, and for data exchange and transmission between a computer and other digital products such as a memory card, a flash drive, and so forth.

For example, resistive random access memory (RRAM) cells are nonvolatile memory cells that store information by changes in its electrical resistance, not by the changes in charge storage. The resistance of the RRAM cell varies according to an applied voltage, so as to store information. In this regard, the RRAM cells serve as an important part in the memory technology. However, manufacturing technique and operation stability of the current RRAM cells are in strong demands in the category of nonvolatile memory.

SUMMARY

An aspect of the present disclosure provides a nonvolatile memory including a first memory unit, a second memory unit, and an isolation transistor. The first memory unit includes a first bipolar-variable-resistance transistor and a first control transistor which are electrically connected to each other. The first bipolar-variable-resistance transistor is electrically connected to a word-line selecting driving circuit, and the first control transistor is electrically connected to a control-line selecting driving circuit. When the first control transistor is driven by the control-line selecting driving circuit, the first bipolar-variable-resistance transistor is configured to receive a first current flow from a bit-line selecting driving circuit through the first control transistor. The second memory unit includes a second bipolar-variable-resistance transistor and a second control transistor which are electrically connected to each other. The second bipolar-variable-resistance transistor is electrically connected to the word-line selecting driving circuit, and the second control transistor is electrically connected to the control-line selecting driving circuit. When the second control transistor is driven by the control-line selecting driving circuit, the second bipolar-variable-resistance transistor is configured to receive a second current flow from the bit-line selecting driving circuit through the second control transistor. The isolation transistor is coupled between the first and second memory units and configured to electrically isolate the first and second memory units from each other.

In some embodiments, the nonvolatile memory further includes a fin structure extending along a direction. The first control transistor, the first bipolar-variable-resistance transistor, the isolation transistor, the second bipolar-variable-resistance transistor, and the second control transistor respectively comprise gate structures arranged along the direction on the fin structure.

In some embodiments, the isolation transistor has a gate terminal electrically connected to a ground-line selecting driving circuit through a ground line.

In some embodiments, the isolation transistor includes a gate structure. The nonvolatile memory further includes an inter-layer dielectric (ILD) layer covering the gate structure of the isolation transistor, so as to allow a gate terminal of the isolation transistor to have a floating electrical potential.

An aspect of the present disclosure provides a nonvolatile memory including a first memory unit, a second memory unit, and an isolation region. The first memory unit includes a first bipolar-variable-resistance transistor and a first control transistor which are electrically connected to each other. The first bipolar-variable-resistance transistor is electrically connected to a word-line selecting driving circuit, and the first control transistor is electrically connected to a control-line selecting driving circuit. When the first control transistor is driven by the control-line selecting driving circuit, the first bipolar-variable-resistance transistor is configured to receive a first current flow from a bit-line selecting driving circuit through the first control transistor. The second memory unit includes a second bipolar-variable-resistance transistor and a second control transistor which are electrically connected to each other. The second bipolar-variable-resistance transistor is electrically connected to the word-line selecting driving circuit, and the second control transistor is electrically connected to the control-line selecting driving circuit. When the second control transistor is driven by the control-line selecting driving circuit, the second bipolar-variable-resistance transistor is configured to receive a second current flow from the bit-line selecting driving circuit through the second control transistor. The isolation region is arranged between the first and second bipolar-variable-resistance transistors and configured to electrically isolate the first and second memory units from each other.

In some embodiments, the nonvolatile memory further includes a fin structure extending along a direction. The first control transistor, the first bipolar-variable-resistance transistor, the second bipolar-variable-resistance transistor, and the second control transistor respectively comprise gate structures arranged along the direction on the fin structure, and the isolation region is within the fin structure.

An aspect of the present disclosure provides a nonvolatile memory including a first bipolar-variable-resistance transistor, a first control transistor, a second bipolar-variable-resistance transistor, a second control transistor, and an isolation transistor. The first bipolar-variable-resistance transistor has a first source/drain (S/D) terminal and a second S/D terminal. The first control transistor is electrically connected between a first bit line and the first S/D terminal of the first bipolar-variable-resistance transistor, in which the first bipolar-variable-resistance transistor is electrically connected to the first bit line through the first control transistor. The second bipolar-variable-resistance transistor has a third S/D terminal and a fourth S/D terminal. The second control transistor is electrically connected between a second bit line and the fourth S/D terminal of the second bipolar-variable-resistance transistor, and the second bipolar-variable-resistance transistor is electrically connected to the second bit line through the second control transistor. The isolation transistor is coupled between the second S/D terminal of the first bipolar-variable-resistance transistor and the fourth S/D terminal of the second bipolar-variable-resistance transistor.

In some embodiments, the first and second bit lines are electrically connected to a bit-line selecting driving circuit. The first bipolar-variable-resistance transistor has a first gate terminal. The second bipolar-variable-resistance transistor has a second gate terminal. The nonvolatile memory further includes a first word line and a second word line. The first word line is configured to electrically connect the first gate terminal of the first bipolar-variable-resistance transistor with a word-line selecting driving circuit. The resistance of the first bipolar-variable-resistance transistor has equivalent to or more than two stable states by voltage or current which is applied to the first bipolar-variable-resistance transistor by the bit-line selecting driving circuit and the word-line selecting driving circuit. The second word line is configured to electrically connect the second gate terminal of the second bipolar-variable-resistance transistor with the word-line selecting driving circuit. The resistance of the second bipolar-variable-resistance transistor has equivalent to or more than two stable states by voltage or current which is applied to the second bipolar-variable-resistance transistor by the bit-line selecting driving circuit and the word-line selecting driving circuit.

In some embodiments, a portion of the first bipolar-variable-resistance transistor between the first and second S/D terminals is a channel region configured to control at least one current flow to pass therethrough, and the first bipolar-variable-resistance transistor further includes a gate structure. The gate structure includes a pair of spacers, at least one gate metal layer, a high-k dielectric layer, a semiconductor oxide layer, and a barrier layer. The gate metal layer is disposed between the spacers and on the channel region. The high-k dielectric layer is disposed between the spacers and between the channel region and the gate metal layer. The semiconductor oxide layer is disposed between the spacers and between the high-k dielectric layer and the channel region. The barrier layer is disposed between the spacers and between the high-k dielectric layer and the gate metal layer.

An aspect of the present disclosure provides a method for operating a nonvolatile memory. The method includes steps as follows. A first control transistor of a first memory unit is driven and conducted through a first control line and a first bit line. A first bipolar-variable-resistance transistor of the first memory unit is provided with a first current flow from a bit-line selecting driving circuit through the first control transistor and the first bit line. The first bit line is selected by the bit-line selecting driving circuit and a first word line is selected by a word-line selecting driving circuit, so as to apply a bias to the first bipolar-variable-resistance transistor.

In some embodiments, the method further includes steps as follows. A second control transistor of a second memory unit is driven and conducted through a second control line and a second bit line. A second bipolar-variable-resistance transistor of the second memory unit is provided with a second current flow from the bit-line selecting driving circuit through the second control transistor and the second bit line. The second bit line is selected by the bit-line selecting driving circuit and a second word line is selected by the word-line selecting driving circuit, so as to apply a bias to the second bipolar-variable-resistance transistor. The first and second bipolar-variable-resistance transistors are electrically isolated from each other by breaking a current path in a channel region of an isolation transistor.

In some embodiments, applying the bias to the first bipolar-variable-resistance transistor further includes applying the bias to a barrier layer and a high-k dielectric layer of the first bipolar-variable-resistance transistor, such that a resistance of a semiconductor oxide layer of the first bipolar-variable-resistance transistor is varied.

In some embodiments, the method further includes steps as follows. A first bias is applied to the first bipolar-variable-resistance transistor, so as to set a resistance of the first bipolar-variable-resistance transistor in a first state. A second bias is applied to the first bipolar-variable-resistance transistor, so as to change the resistance of the first bipolar-variable-resistance transistor from the first state into a second state.

In some embodiments, the method further includes selecting the first bit line by the bit-line selecting driving circuit and selecting the first word line by the word-line selecting driving circuit to generate a current passing through the first bipolar-variable-resistance transistor, in which the resistance of the first bipolar-variable-resistance transistor is identified as being in the first state or the second state in response to the generated current.

DETAILED DESCRIPTION

Figure 1A:
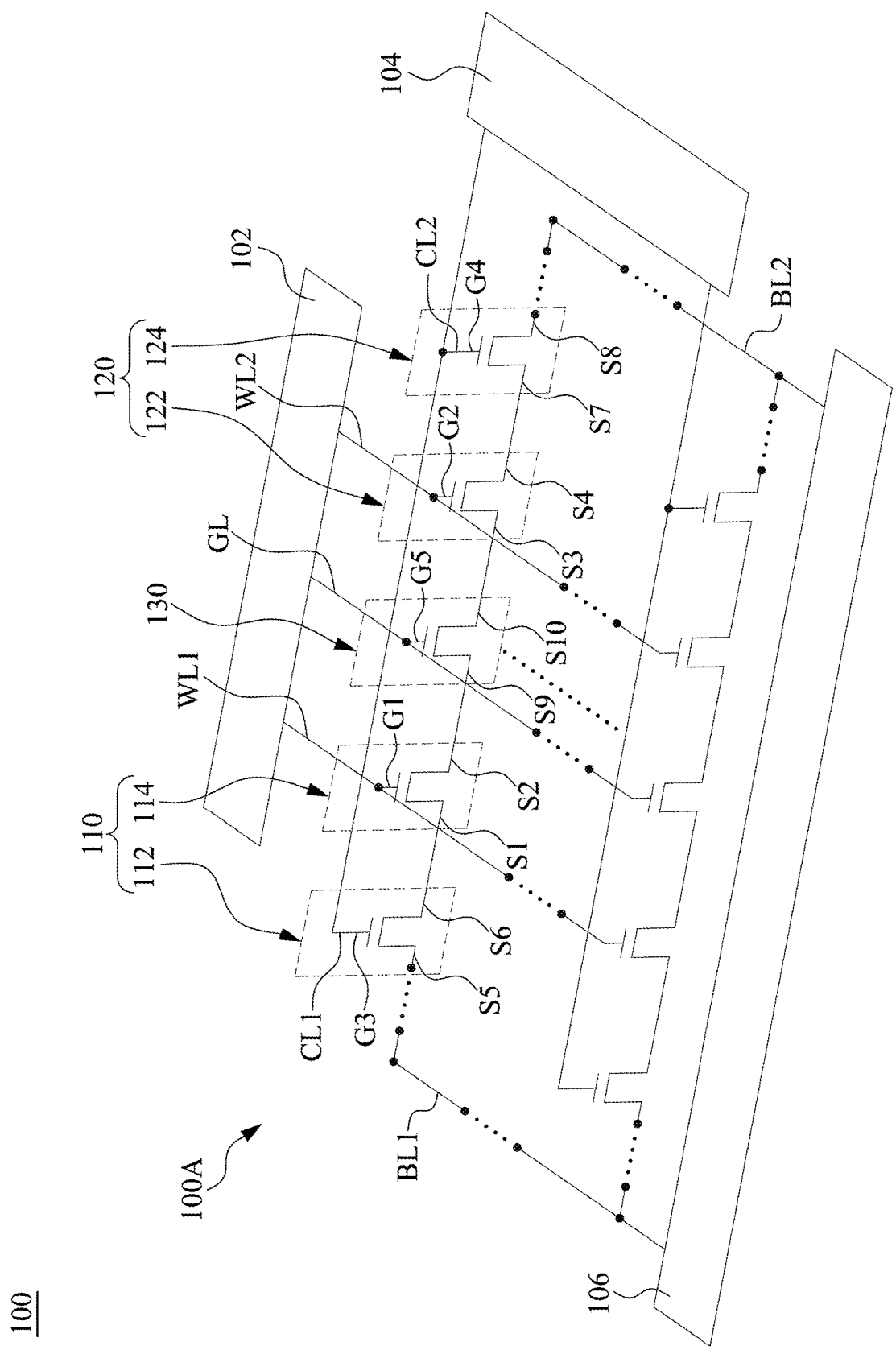
FIG. 1A is an equivalent circuit diagram of a memory array and circuit according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms first, second may be used herein to describe various elements, these elements should not be limited by these terms. These terms are only used to distinguish one element from another element.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

Figure 1B:
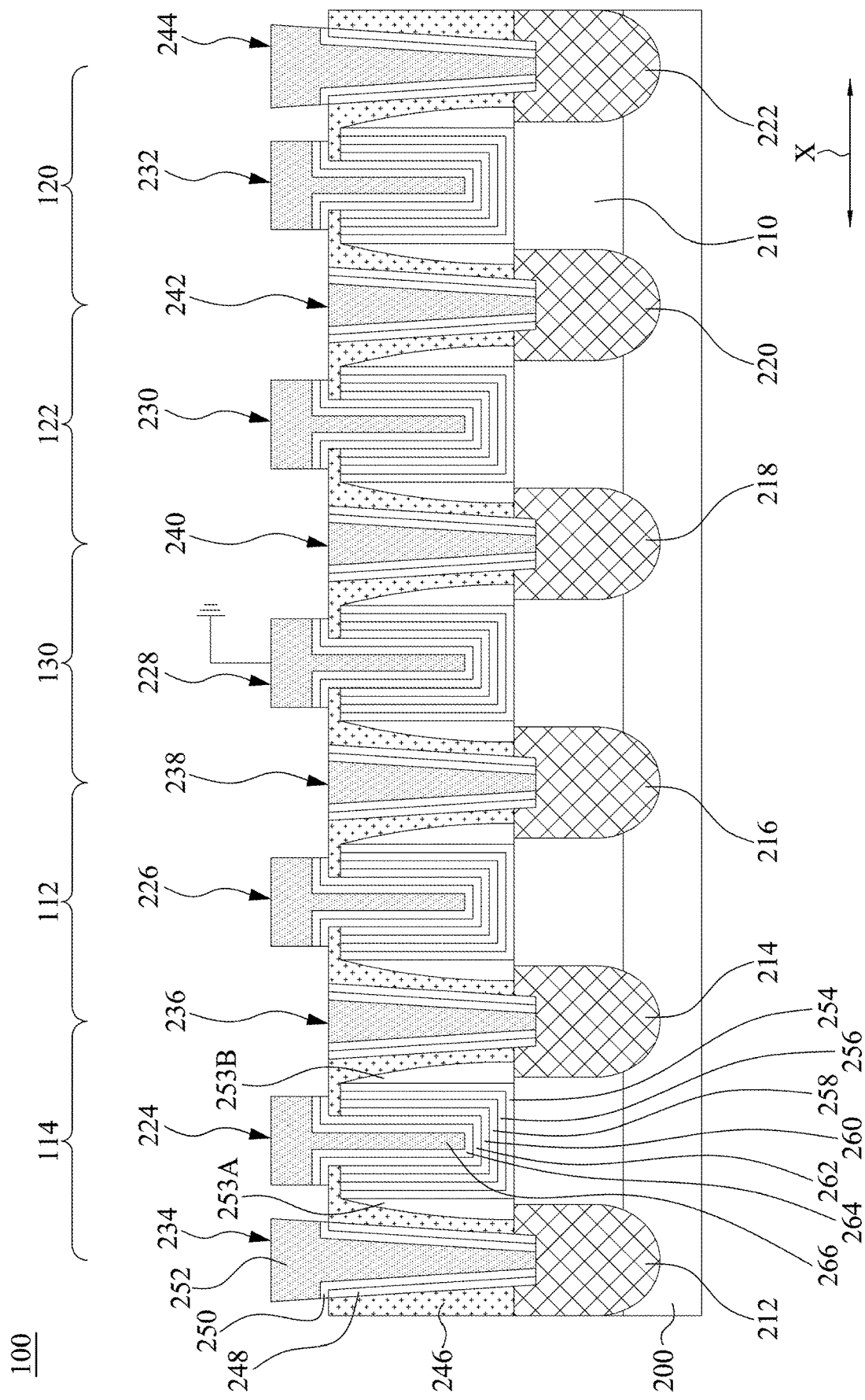
FIG. 1B is a cross-sectional view of a structure corresponding to a first memory unit, an isolation transistor, and a second memory unit of FIG. 1A.

Reference is made to FIGS. 1A and 1B. FIG. 1A is an equivalent circuit diagram of a memory array and circuit according to a first embodiment of the present disclosure. FIG. 1B is a cross-sectional view of a structure corresponding to a first memory unit 110, an isolation transistor 130, and a second memory unit 120 of FIG. 1A. The memory circuit 100A of the present disclosure can be a bipolar resistive random access memory (RRAM) circuit using at least one bipolar-variable-resistance transistor. Furthermore, the memory circuit 100A of the present disclosure can be applied to serve as a nonvolatile memory. That is, the memory circuit 100A of the present disclosure can be applied to serve as a flash memory device. The memory circuit 100A includes an array of transistors that are arranged in rows and columns. Illustrated in FIG. 1A are two rows of transistors and five transistors in each row. However, it is acknowledged that the amount of rows and the amount of transistors in each row are only for clarity, not intended to limit the scope of the present disclosure.

As shown in FIG. 1A, the memory device 100 includes a first memory unit 110, a second memory unit 120, and an isolation transistor 130, in which the first memory unit 110, the second memory unit 120, and the isolation transistor 130 can be arranged to form the memory circuit 100A. The first memory unit 110 includes a first bipolar-variable-resistance transistor 112 and a first control transistor 114 which are electrically connected to each other. The second memory unit 120 includes a second bipolar-variable-resistance transistor 122 and a second control transistor 124 which are electrically connected to each other. The isolation transistor 130 is coupled between the first and second memory units 110, 120 and configured to electrically isolate the first and second memory units 110, 120 from each other. A description with respect to the structure corresponding to the first memory unit 110, the second memory unit 120, and the isolation transistor 130 is given below.

As shown in FIG. 1B, the memory device 100 includes a substrate 200, a plurality of gate structures 224, 226, 228, 230, 232, a plurality of conductive plug 234, 236, 238, 240, 242, 244, and an inter-layer dielectric (ILD) layer 246. The substrate 200 includes a fin structure 210 extending along X-direction of FIG. 1B and a punch through stopper layer, in which the fin structure 210 is above the punch through stopper layer. The fin structure 210 may be a silicon-on-insulator (SOI) wafer, a silicon wafer, an epitaxial silicon layer, an epitaxial germanium layer, an epitaxial silicon-germanium layer, an epitaxial silicon-carbon layer, an epitaxial germanium-stannum layer, a region doped by P-type dopant, a region doped by N-type dopant, or combinations thereof. The fin structure 210 has source/drain (S/D) regions 212, 214, 216, 218, 220, 222, and the S/D regions 212, 214, 216, 218, 220, 222 may have lightly doped source and drain (LDD) regions and heavily doped source and drain regions. For example, during the formation of the S/D regions 212, 214, 216, 218, 220, 222, dopants can be introduced into the S/D regions 212, 214, 216, 218, 220, 222, in which the dopants may include P-type dopants, N-type dopants, or other suitable dopants.

The gate structures 224, 226, 228, 230, 232, the conductive plugs 234, 236, 238, 240, 242, 244, and the ILD layer 246 are disposed on the substrate, in which the gate structures 224, 226, 228, 230, 232 and the conductive plugs 234, 236, 238, 240, 242, 244 are arranged along X-direction of FIG. 1B.

The conductive plugs 234, 236, 238, 240, 242, 244 are respectively disposed on the S/D regions 212, 214, 216, 218, 220, 222 and electrically connected to the S/D regions 212, 214, 216, 218, 220, 222. Each of the conductive plugs 234, 236, 238, 240, 242, 244 can be formed by using more than one layer. For example, the conductive plugs 234 includes a first protect layer 248, a first barrier layer 250, and a first conductive filling 252. In the structure of the conductive plug 234, the first conductive filling 252 is surrounded by the first barrier layer 250, and the first barrier layer 250 is surrounded by the first protect layer 248. Sidewalls of the conductive plugs 234, 236, 238, 240, 242, 244 can be covered by the ILD layer 246. Example materials of the first conductive filling 252 include metal, such as tungsten, tungsten disulfide, Ti, TiN, Ta, TaN, tungsten nitride, cobalt, cobalt sulfide, cobalt nitride, or combinations thereof.

The gate structures 224, 226, 228, 230, 232 are disposed on the fin structure 210, in which the conductive plugs 234, 236, 238, 240, 242, 244 and the gate structures 224, 226, 228, 230, 232 are alternately arranged along X-direction of FIG. 1B. Furthermore, some portions of the fin structure 210 under the gate structures 224, 226, 228, 230, 232 may serve as channel regions. For example, a portion of the fin structure 210 under the gate structure 224 and between the S/D regions 212, 214 can serve as a channel region.

Each of the gate structures 224, 226, 228, 230, 232 may have a configuration which can be referred to as a high k-Metal-Gate (HKMG) structure. For example, the gate structure 224 has a pair of spacer 253A, 253B, a semiconductor oxide layer 254, a high-k dielectric layer 256, a second barrier layer 258, a work function layer 260, a second protection layer 262, a third barrier layer 264, and a second conductive filling 266.

The spacer 253A, 253B are disposed on the fin structure 210 and are collectively configured to define a space for filling more than one layer therein. For example the semiconductor oxide layer 254, the high-k dielectric layer 256, the second barrier layer 258, the work function layer 260, the second protection layer 262, the third barrier layer 264, and the second conductive filling 266 can be disposed in the space between the spacers 253A, 253B. The semiconductor oxide layer 254 is disposed on the fin structure 210, in which the semiconductor oxide layer 254 can serve as a gate oxide layer of the gate structure 224. The high-k dielectric layer 256 is disposed on the semiconductor oxide layer 254 and is surrounded by the semiconductor oxide layer 254. The second barrier layer 258 is disposed on the high-k dielectric layer 256 and is surrounded by the high-k dielectric layer 256. The work function layer 260 is disposed on the second barrier layer 258 and is surrounded by the second barrier layer 258. The second protection layer 262, the third barrier layer 264, and the second conductive filling 266 are disposed on the work function layer 260 and extend from the space between the spacers 253A, 253B to a position higher than the ILD layer 246. The second conductive filling 266 can serve as a gate metal layer of the gate structure 224.

Example materials of the semiconductor oxide layer 254 include silicon nitride, silicon oxynitride, silicon carbide, silicon oxide, silicon carbon nitride, or combinations thereof. Example materials of the high-k dielectric layer 256 include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, or combinations thereof. Example materials of the second barrier layer 258 include titanium nitride, titanium nitrogen aluminide, tantalum mononitride, tantalum nitrogen aluminide, or combinations thereof. Example materials of the second conductive filling 266 include metal, such as tungsten, tungsten disulfide, Ti, TiN, Ta, TaN, tungsten nitride, cobalt, cobalt sulfide, cobalt nitride, or combinations thereof.

The fin structure 210, the S/D regions 212, 214, 216, 218, 220, 222, and the gate structures 224, 226, 228, 2230, 232 described above can collectively serve as the first control transistor 114, the first bipolar-variable-resistance transistor 112, the isolation transistor 130, the second bipolar-variable-resistance transistor 122, and the second control transistor 124.

Accordingly, the S/D regions 214, 216, the gate structure 226, and a portion of the fin structure 210 under the gate structure 226 can respectively serve as a first S/D terminal, a second S/D terminal, a first gate terminal, and a first channel region of the first bipolar-variable-resistance transistor 112. The S/D regions 218, 220, the gate structure 230, and a portion of the fin structure 210 under the gate structure 230 can respectively serve as a third S/D terminal, a fourth S/D terminal, a second gate terminal, and a second channel region of the second bipolar-variable-resistance transistor 122. The S/D regions 212, 214, the gate structure 224, and a portion of the fin structure 210 under the gate structure 224 can respectively serve as a fifth S/D terminal, a sixth S/D terminal, a third gate terminal, and a third channel region of the first control transistor 114. The S/D regions 220, 222, the gate structure 232, and a portion of the fin structure 210 under the gate structure 232 can respectively serve as a seventh S/D terminal, an eighth S/D terminal, a fourth gate terminal, and a fourth channel region of the second control transistor 124. In addition, the S/D regions 216, 218, the gate structure 228, and a portion of the fin structure 210 under the gate structure 228 can respectively serve as a ninth S/D terminal, a tenth S/D terminal, a fifth gate terminal, and a fifth channel region of the isolation transistor 130.

With the above configuration, the first control transistor 114, the first bipolar-variable-resistance transistor 112, the isolation transistor 130, the second bipolar-variable-resistance transistor 122, and the second control transistor 124 can be arranged along X-direction of FIG. 1B. Furthermore, the gate structures 224, 226, 228, 230, 232 respectively serving the gate terminals of the first control transistor 114, the first bipolar-variable-resistance transistor 112, the isolation transistor 130, the second bipolar-variable-resistance transistor 122, and the second control transistor 124 are arranged along X-direction of FIG. 1B on the fin structure 210. In other words, the first control transistor 114, the first bipolar-variable-resistance transistor 112, the isolation transistor 130, the second bipolar-variable-resistance transistor 122, and the second control transistor 124 may share the same fin structure 210.

With the above configuration, the formation of the first control transistor 114, the first bipolar-variable-resistance transistor 112, the isolation transistor 130, the second bipolar-variable-resistance transistor 122, and the second control transistor 124 can be performed by the same process, thereby reducing the number of the masks used in the process and reducing the cost of the manufacturing process. For example, after the formation of the fin structure 210 of the memory device 100, the gate structures 224, 226, 228, 230, 232 used in the first control transistor 114, the first bipolar-variable-resistance transistor 112, the isolation transistor 130, the second bipolar-variable-resistance transistor 122, and the second control transistor 124 can be formed by the same process. Moreover, since the first control transistor 114, the first bipolar-variable-resistance transistor 112, the isolation transistor 130, the second bipolar-variable-resistance transistor 122, and the second control transistor 124 can be formed from the same fin structure 210, the dimension of the memory device 100 can be reduced, such as reducing the volume of the memory device 100.

Each pair of the adjacent transistors can be electrically connected to each other by the corresponding S/D regions 212, 214, 216, 218, 220, 222. For example, as shown in FIG. 1A, the sixth S/D terminal S6 of the first control transistor 114 is electrically connected to the first S/D terminal S1 of the first bipolar-variable-resistance transistor 112. The second S/D terminal S2 of the first bipolar-variable-resistance transistor 112 is electrically connected to the ninth S/D terminal S9 of the isolation transistor 130. The tenth S/D terminal S10 of the isolation transistor 130 is electrically connected to the third S/D terminal S3 of the second bipolar-variable-resistance transistor 122. The fourth S/D terminal S4 of the second bipolar-variable-resistance transistor 122 is electrically connected to the seventh S/D terminal S7 of the second control transistor 124. Accordingly, the transistors are electrically connected in series.

Furthermore, the memory device 100 may further include a first driver 102, a second driver 104, a third driver 106, a first word line WL1, a second word line WL2, a first control line CL1, a second control line CL2, a first bit line BL1, a second bit line BL2, a ground line GL. The first driver 102 includes a word-line selecting driving circuit and a ground-line selecting driving circuit therein. The second driver 104 includes a control-line selecting driving circuit therein. The third driver 106 includes a bit-line selecting driving circuit and a sense amplifier therein.

The first word line WL1 can be electrically connected to the first gate terminal G1 of the first bipolar-variable-resistance transistor 112, such that the first gate terminal G1 of the first bipolar-variable-resistance transistor 112 can be electrically connected to the word-line selecting driving circuit of the first driver 102. The second word line WL2 can be electrically connected to the second gate terminal G2 of the second bipolar-variable-resistance transistor 122, such that the second gate terminal G2 of the second bipolar-variable-resistance transistor 122 can be electrically connected to the word-line selecting driving circuit of the first driver 102.

The first control line CL1 can be electrically connected to the third gate terminal G3 of the first control transistor 114, such that the first control line CL1 can be configured to electrically connect the third gate terminal G3 of the first control transistor 114 with the control-line selecting driving circuit of the second driver 104. The second control line CL2 can be electrically connected to the fourth gate terminal G4 of the second control transistor 124, such that the second control line CL2 can be configured to electrically connect the fourth gate terminal G4 of the second control transistor 124 with the control-line selecting driving circuit of the second driver 104.

The first bit line BL1 can be electrically connected to the fifth S/D terminal S5 of the first control transistor 114, such that the first bit line BL1 can be configured to electrically connect the fifth S/D terminal S5 of the first control transistor 114 with the bit-line selecting driving circuit of the third driver 106. The second bit line BL2 can be electrically connected to the eighth S/D terminal S8 of the second control transistor 124, such that the second bit line BL2 can be configured to electrically connect the eighth S/D terminal S8 of the second control transistor 124 with the bit-line selecting driving circuit of the third driver 106.

With the above configuration, each of the memory units can achieve a function of storing information by performing different operations. For example, with respect to the first memory unit 110, the resistance, conductivity or conducting current of the first bipolar-variable-resistance transistor 112 can have equivalent to or more than two stable states by voltage or current which is applied to the first bipolar-variable-resistance transistor 112. For example, the resistance, conductivity or conducting current of the high-k dielectric layer 256 (see FIG. 1B) and the second barrier layer 258 (see FIG. 1B) may have equivalent to or more than two stable states by voltage or current which is applied thereto. Therefore, the resistance, conductivity or conducting current of the first bipolar-variable-resistance transistor 112 can be adjusted by applying voltage or bias to the gate and S/D terminals of the first bipolar-variable-resistance transistor 112. Then, the state of the first bipolar-variable-resistance transistor 112 can be defined by the current passing through.

Figure 1C:
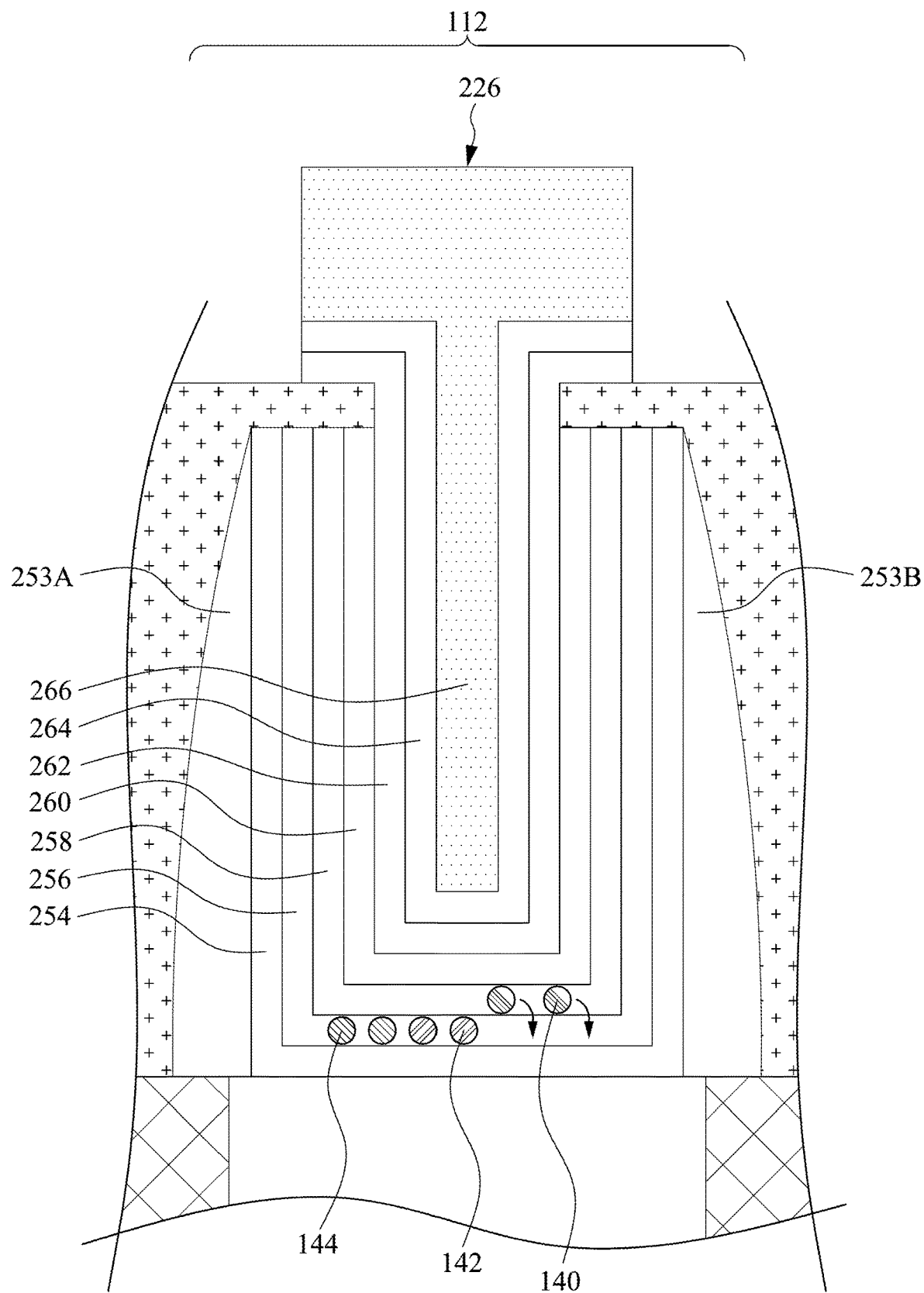
FIGS. 1C, 1D, and 1E are enlargement diagrams of the first bipolar-variable-resistance transistor of FIG. 1B.
Figure 1D:
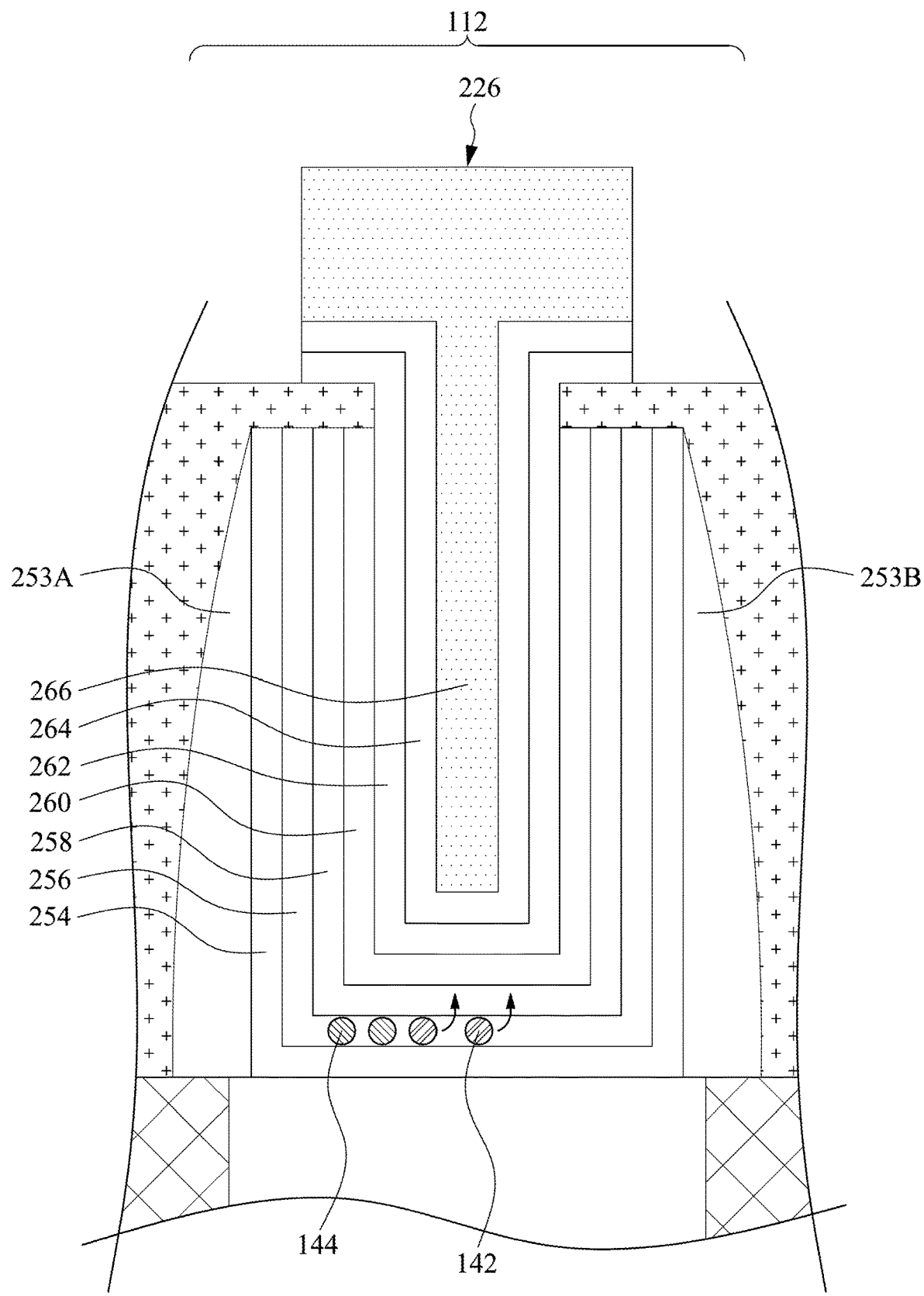
Figure 1E:
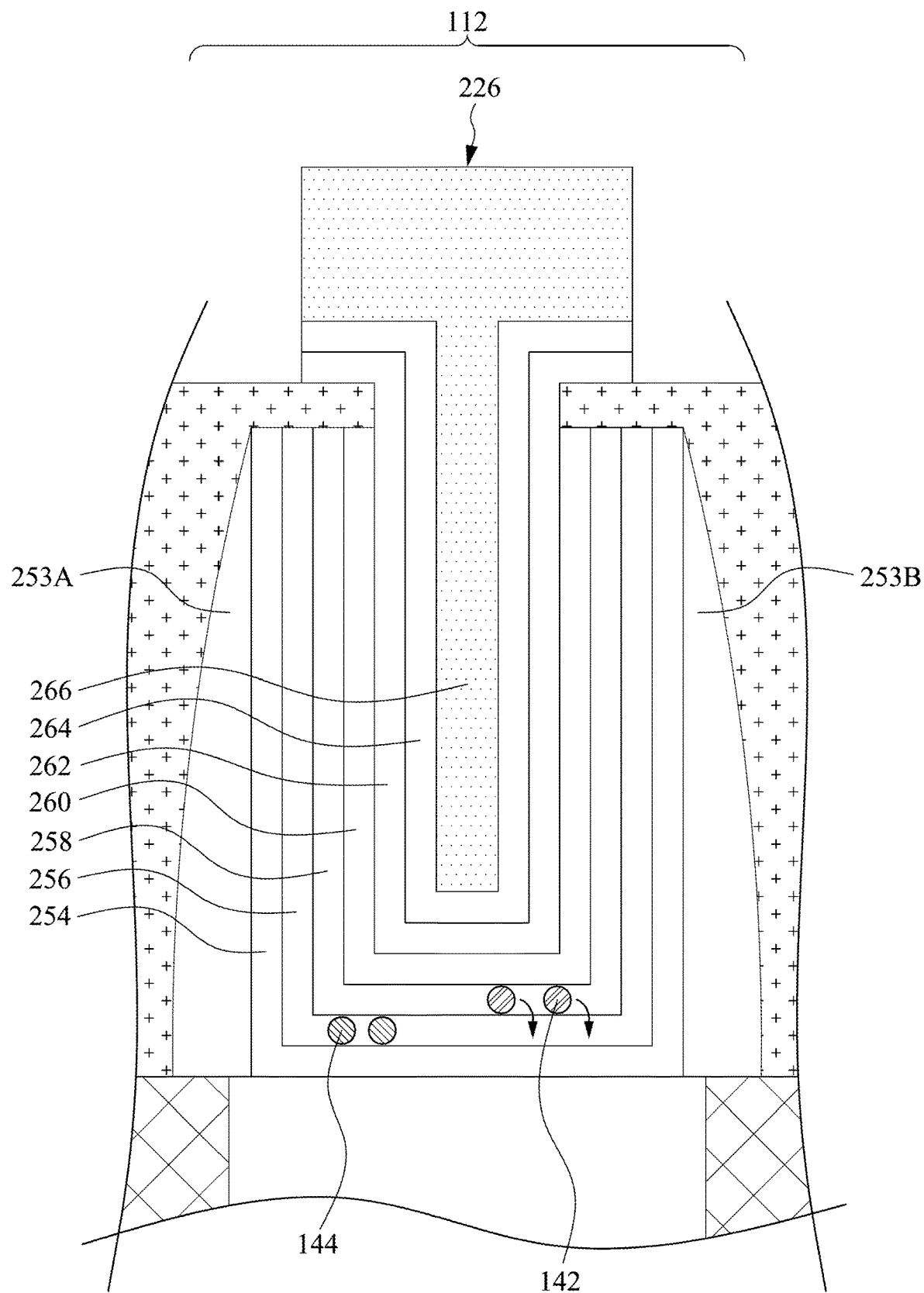

For example, FIGS. 1C, 1D, and 1E are enlargement diagrams of the first bipolar-variable-resistance transistor 112 of FIG. 1B. As shown in FIG. 1C, as the high-k dielectric layer 256 and the second barrier layer 258 respectively have $HfO_2$ and TiN, a post-metal anneal process can be performed after the formation of the high-k dielectric layer 256 and the second barrier layer 258, so as to cure defects generated at the interface in the resulting structure. During the post-metal anneal process, due to different concentration gradients of nitrogen ions 140 of TiN in a high temperature environment, the nitrogen ions 140 of TiN may diffuse to the high-k dielectric layer 256. It causes a pair of a vacancy 142 and an oxygen ion 144 in the high-k dielectric layer 256.

Then, as shown in FIG. 1D, if a positive bias is applied to the gate terminal of the first bipolar-variable-resistance transistor 112, the oxygen ions 144 in the high-k dielectric layer 256 would be drawn by the electric field and attracted to the second barrier layer 258. Since the second barrier layer 258 in a solid phase has a relatively high solubility with respect to the oxygen ions 144, the oxygen ions 144 can be stored in the second barrier layer 258. In this regard, the vacancies 142 remaining in the high-k dielectric layer 256 would accumulate to become a conducting filament, such that the resistance of the semiconductor oxide layer 254 is changed from a higher value to a lower value. Such change can be referred to as a "low-resistance-state (LRS)."

On the other hand, as shown in FIG. 1E, if a negative bias is applied to the gate terminal of the first bipolar-variable-resistance transistor 112, the negative bias would draw the oxygen ions 144 stored in the second barrier layer 258 from the second barrier layer 258 to the semiconductor oxide layer 254. The drawn oxygen ions 144 may recombine with the vacancies 142 in the top of the conducting filament. Accordingly, the top of the conducting filament may be cut off, such that the semiconductor oxide layer 254 is changed from a lower value to a higher value. Such change can be referred to as a "high-resistance-state (HRS)." With such mechanism, the HKMG structure of the first bipolar-variable-resistance transistor 112 can perform characteristics of RRAM through the high-k dielectric layer 256 and the second barrier layer 258 thereof.

Figure 1F:
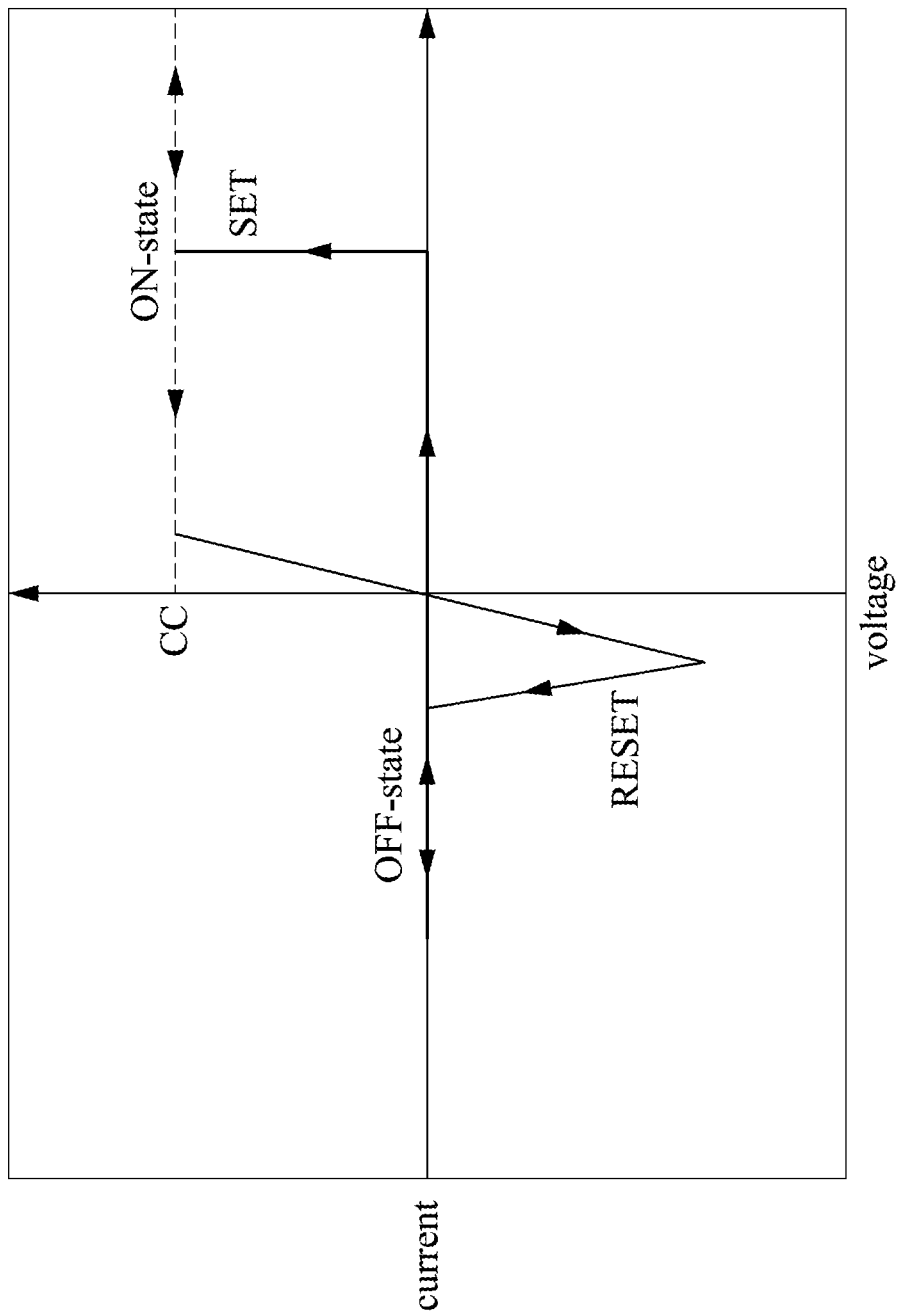
FIG. 1F is a current-voltage diagram illustrating an operation of a bipolar-variable-resistance transistor.
Figure 1G:
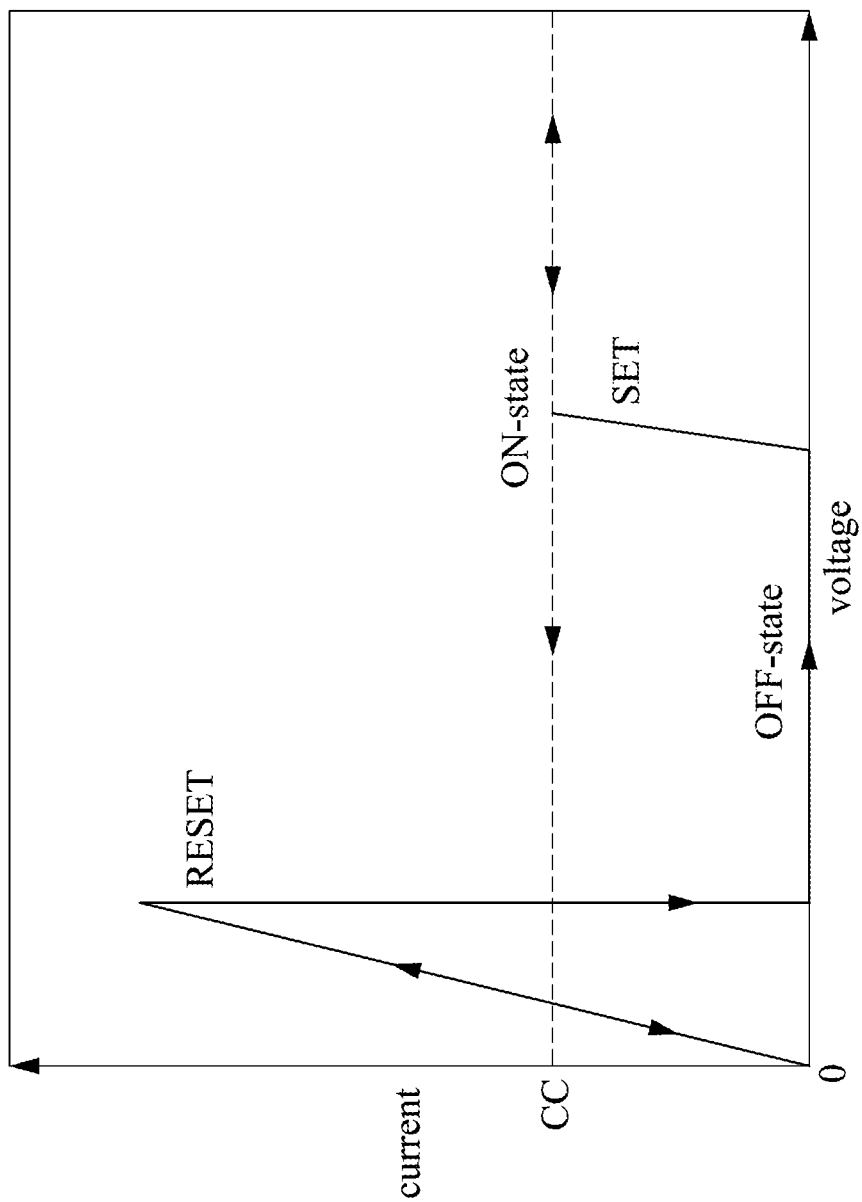
FIG. 1G is a current-voltage diagram illustrating an operation of an unipolar-variable-resistance transistor.

Furthermore, FIG. 1F is a current-voltage diagram illustrating an operation of a bipolar-variable-resistance transistor, and FIG. 1G is a current-voltage diagram illustrating an operation of an unipolar-variable-resistance transistor. The horizontal axes of FIGS. 1F and 1G represent voltage, and the vertical axes of FIGS. 1F and 1G represent current, in which both of the voltage and the current are in arbitrary unit herein. There are two mechanisms in RRAM. One of them is a bipolar operation, and another one is a unipolar operation. The physical mechanism of the bipolar operation is different than that of the unipolar operation. According to illustrations of FIGS. 1F and 1G, the polarities with respect to the applied voltage in set/reset of the bipolar operation are opposite (i.e., the "set" is positive and the "reset" is negative), and the leading mechanism is a recombination of the oxygen ions and the oxygen vacancies in the oxide layer. On the other hand, the polarities with respect to the applied voltage in set/reset of the unipolar operation are the same (i.e., the "set" and "reset" are positive or the "set" and "reset" are negative), and the leading mechanism can be referred to as a "filament cutting mechanism by Joule heating."

Figure 1H:
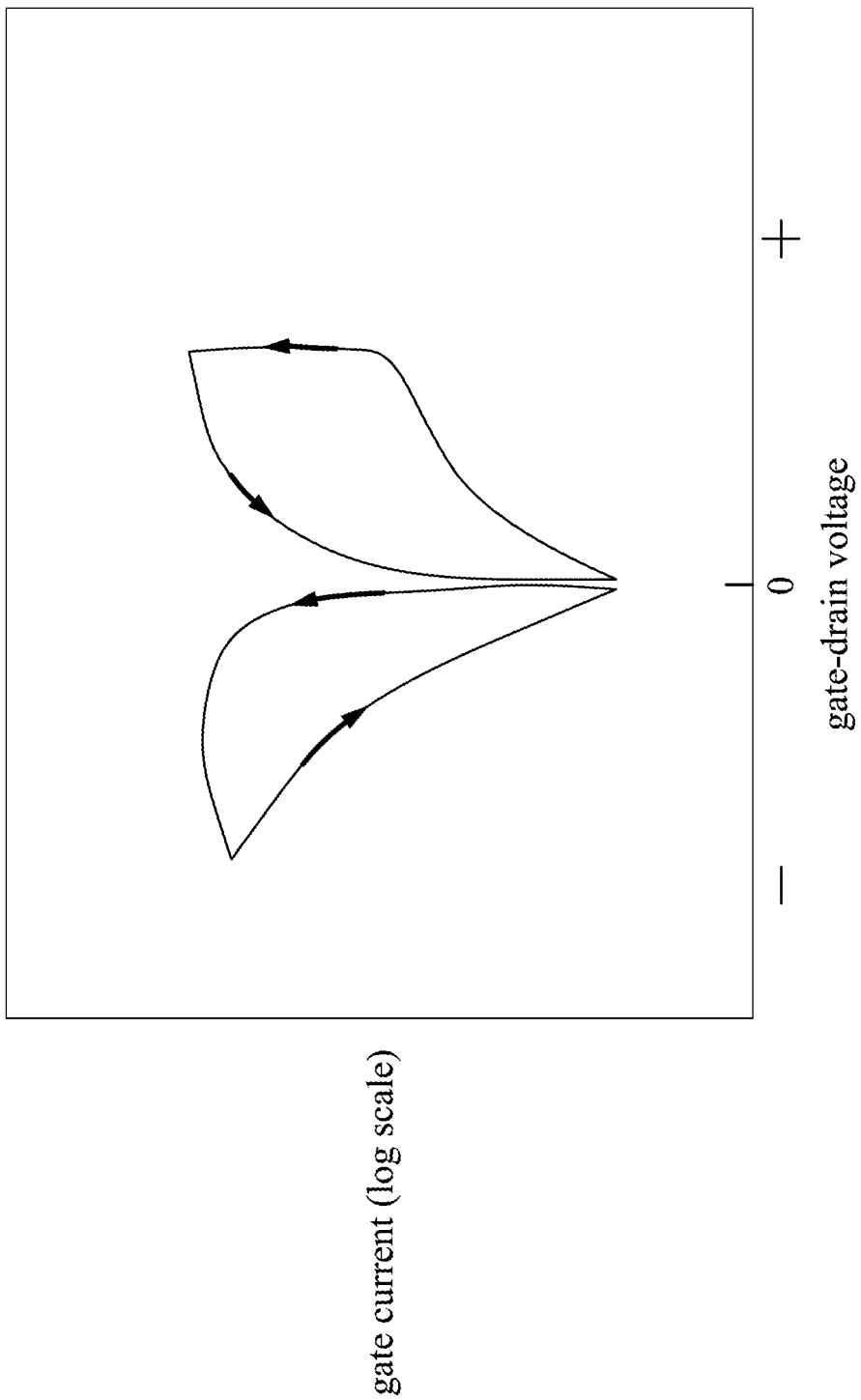
FIG. 1H is a current-voltage diagram illustrating an operation of the first bipolar-variable-resistance transistor.

Therefore, according to the mechanisms as described in FIG. 1C, FIG. 1D, and FIG. 1E, the first memory unit 110 can be referred to as a bipolar memory. FIG. 1H is a current-voltage diagram illustrating an operation of the first bipolar-variable-resistance transistor 112 of the first memory unit 110. The horizontal axis of FIG. 1H represents gate-drain voltage, the vertical axis of FIG. 1H represents gate current and is log scale, in which both of the voltage and the current are in arbitrary unit herein.

The above operations of the first memory unit 110 can be divided into a SET operation, a RESET operation, a reading operation, a forming operation, or combinations thereof. It can be specified that a fixed bias condition should not change the state of the first bipolar-variable-resistance transistor 112 of the first memory unit 110, as the fixed bias condition is applied onto the first bipolar-variable-resistance transistor 112 of the first memory unit 110 before any operation is performed thereto, and the measured conducting current is used as a reference current value.

If an operation is implemented to change the state of the first bipolar-variable-resistance transistor 112 of the first memory unit 110 and thus enables that the conducting current of the first bipolar-variable-resistance transistor 112 of the first memory unit 110 is less relative to the reference current value, this state of the first bipolar-variable-resistance transistor 112 of the first memory unit 110 can be defined as 0. If an operation is implemented to change the state of the first bipolar-variable-resistance transistor 112 of the first memory unit 110 and thus enables that the conducting current of the first bipolar-variable-resistance transistor 112 of the first memory unit 110 becomes larger relative to the reference current value, this state of the first bipolar-variable-resistance transistor 112 of the first memory unit 110 can be defined as 1. Such definition of 0 or 1 is used to identify the relative storage state of the first memory unit 110, and thus the first memory unit 110 may have equivalent to or more than two stable states.

With respect to the setting operation, the RESET operation, the reading operation, and the forming operation, the RESET operation refers to that the first memory unit 110 can be operated to a storage state 1, the SET operation refers to that the first memory unit 110 can be operated to a storage state 0, and the reading operation refers to an operation manner which can read out the storage state 0 or 1 of the first memory unit 110. The forming operation refers to that the first memory unit 110 can be set to a storable and operable state. The details of the operations are given as follows.

When it is desired to operate the first memory unit 110, the forming operation can be performed first, such that the storage state of the first memory unit 110 can be set as 0 or 1. For example, the first control line CL1 and the first bit line BL1 can respectively be selected by the control-line selecting driving circuit of the second driver 104 and the bit-line selecting driving circuit of the third driver 106, so as to drive and conduct the first control transistor 114 of the first memory unit 110. By driving and conducting the first control transistor 114 the first bipolar-variable-resistance transistor 112 can be electrically connected to the first bit line BL1. That is, the first bipolar-variable-resistance transistor 112 can receive a current flow from the bit-line selecting driving circuit through the first control transistor 114 and the first bit line BL1. Accordingly, the current flow can be inputted into the first bipolar-variable-resistance transistor 112 from the bit-line selecting driving circuit through the first control transistor 114 and the first bit line BL1. Then, the first word line WL1 and the first bit line BL1 can respectively be selected by the word-line selecting driving circuit of the first driver 102 and the bit-line selecting driving circuit of the third driver 106, and a voltage or current condition is applied to these lines, so as to change the first bipolar-variable-resistance transistor 112 of the first memory unit 110 from a pre-operation state to a storage state 0 or 1.

When it is desired to perform the resetting operation onto the first memory unit 110, the first control line CL1 and the first bit line BL1 can respectively be selected by the control-line selecting driving circuit of the second driver 104 and the bit-line selecting driving circuit of the third driver 106, so as to drive and conduct the first control transistor 114 of the first memory unit 110. Then, the first word line WL1 and the first bit line BL1 can respectively be selected by the word-line selecting driving circuit of the first driver 102 and the bit-line selecting driving circuit of the third driver 106, and a voltage or current condition is applied to these lines, so as to change the first bipolar-variable-resistance transistor 112 of the first memory unit 110 from a pre-resetting-operation state to a storage state 0.

When it is desired to perform the SET operation onto the first memory unit 110, the first control line CL1 and the first bit line BL1 can respectively be selected by the control-line selecting driving circuit of the second driver 104 and the bit-line selecting driving circuit of the third driver 106, so as to drive and conduct the first control transistor 114 of the first memory unit 110. Then, the first word line WL1 and the first bit line BL1 can respectively be selected by the word-line selecting driving circuit of the first driver 102 and the bit-line selecting driving circuit of the third driver 106, and a voltage or current condition is applied to these lines, so as to change the first bipolar-variable-resistance transistor 112 of the first memory unit 110 from a pre-setting-operation state to a storage state 1.

When it is desired to perform the reading operation onto the first memory unit 110 for reading the information stored in the first memory unit 110, the first control line CL1 and the first bit line BL1 can respectively be selected by the control-line selecting driving circuit of the second driver 104 and the bit-line selecting driving circuit of the third driver 106, so as to drive and conduct the first control transistor 114 of the first memory unit 110. Then, the first word line WL1 and the first bit line BL1 can respectively be selected by the word-line selecting driving circuit of the first driver 102 and the bit-line selecting driving circuit of the third driver 106, and the resistance of the first bipolar-variable-resistance transistor 112 of the first memory unit 110 can be determined according to the applied voltage or current condition. It is noted that the applied voltage or current condition may not change the state of the resistance of the bipolar-variable-resistance transistor 112. The sense amplifier disposed in the third driver 106 can receive the current flow from the bipolar-variable-resistance transistor 112. In this regard, the resistance of the first bipolar-variable-resistance transistor 112 can be identified as being in the storage state 0 or the storage state 1 in response to the generated current.

During the above operations, the unselected bit line, the unselected control line, or the unselected word line can be connected to ground potential or remain floating. Operations with respect to the second memory unit 120 can be the same as the operations with respect to the first memory unit 110, and hence it is not repeated herein. Furthermore, the ground line GL can be electrically connected to the fifth gate terminal G5 of the isolation transistor 130, so as to electrically connect the fifth gate terminal G5 of the isolation transistor 130 with the ground-line selecting driving circuit of the first driver 102.

When a writing operation or a reading operation of the memory circuit 100A is performed by the first and second memory units 110 and 120, the isolation transistor 130 coupled between the first and second memory units 110 and 120 can be configured to electrically isolate the first and second memory units 110 and 120 from each other.

In this regard, since the fifth gate terminal G5 of the isolation transistor 130 is electrically connected to the ground-line selecting driving circuit of the first driver 102, the fifth gate terminal G5 of the isolation transistor 130 may have ground potential. Accordingly, the isolation transistor 130 is not conducted, and thus the unconducted isolation transistor 130 can block or isolate a current flow between the ninth and tenth S/D terminals S9 and S10. That is, the unconducted isolation transistor 130 breaks a current path in a channel region thereof, thereby blocking a current flow flowing from the ninth S/D terminal S9 to the tenth S/D terminal S10 or blocking a current flow flowing from the tenth S/D terminal S10 to the ninth S/D terminal S9. Therefore, the isolation transistor 130 can electrically isolate the second S/D terminal S2 of the first bipolar-variable-resistance transistor 112 of the first memory unit 110 and the third S/D terminal S3 of the second bipolar-variable-resistance transistor 122 of the second memory unit 120 from each other, thereby avoid leakage current generating between the first and second memory units 110 and 120. For example, a sneak current coming from the transistor 114 to another row of transistors through the word line WL1 then going to the transistor 122 through word line WL2 might unintentionally occur. Such a sneak current arriving at the transistor 122 might flow back to transistor 114 if the isolation transistor 130 between the transistors 114 and 122 is conducted, which in turn would result in unwanted leakage current between the transistors 114 and 112. However, because the isolation transistor 130 is unconducted as discussed previously, flowing back of the sneak current from the transistor 122 to the transistor 114 in the same row can be suppressed.

In addition, more than one pair of the memory units can be arranged in the memory circuit 100A. For example, as shown in FIG. 1A, two-pair of the memory units are arranged in the memory circuit 100A, in which an isolation transistor is coupled between each pair of the memory units. By arranging more than one pair of the memory units in the memory circuit 100A, a memory array can be formed in the memory circuit 100A.

Figure 2A:
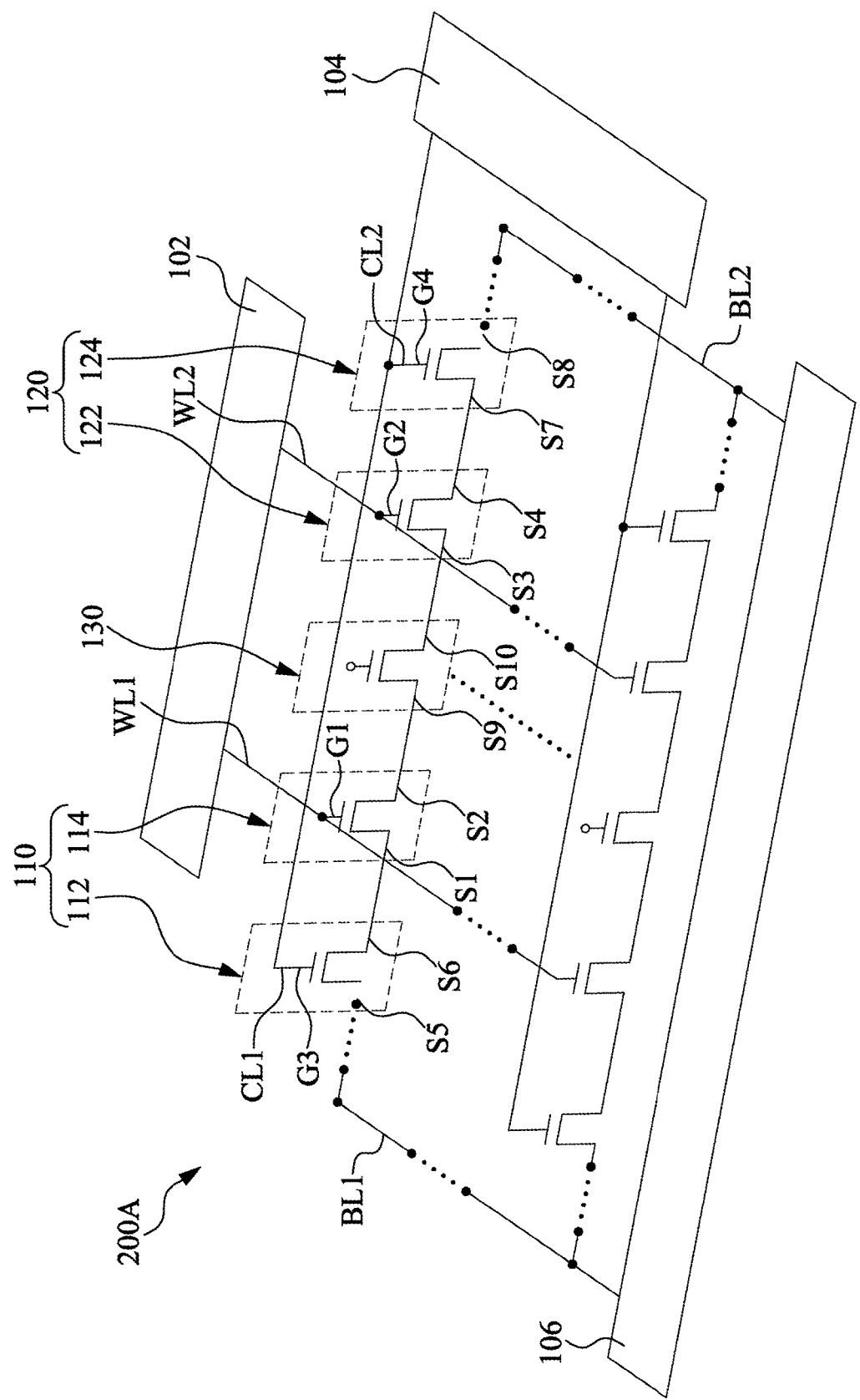
FIG. 2A is an equivalent circuit diagram of a memory circuit of a memory device according to a second embodiment of the present disclosure.
Figure 2B:
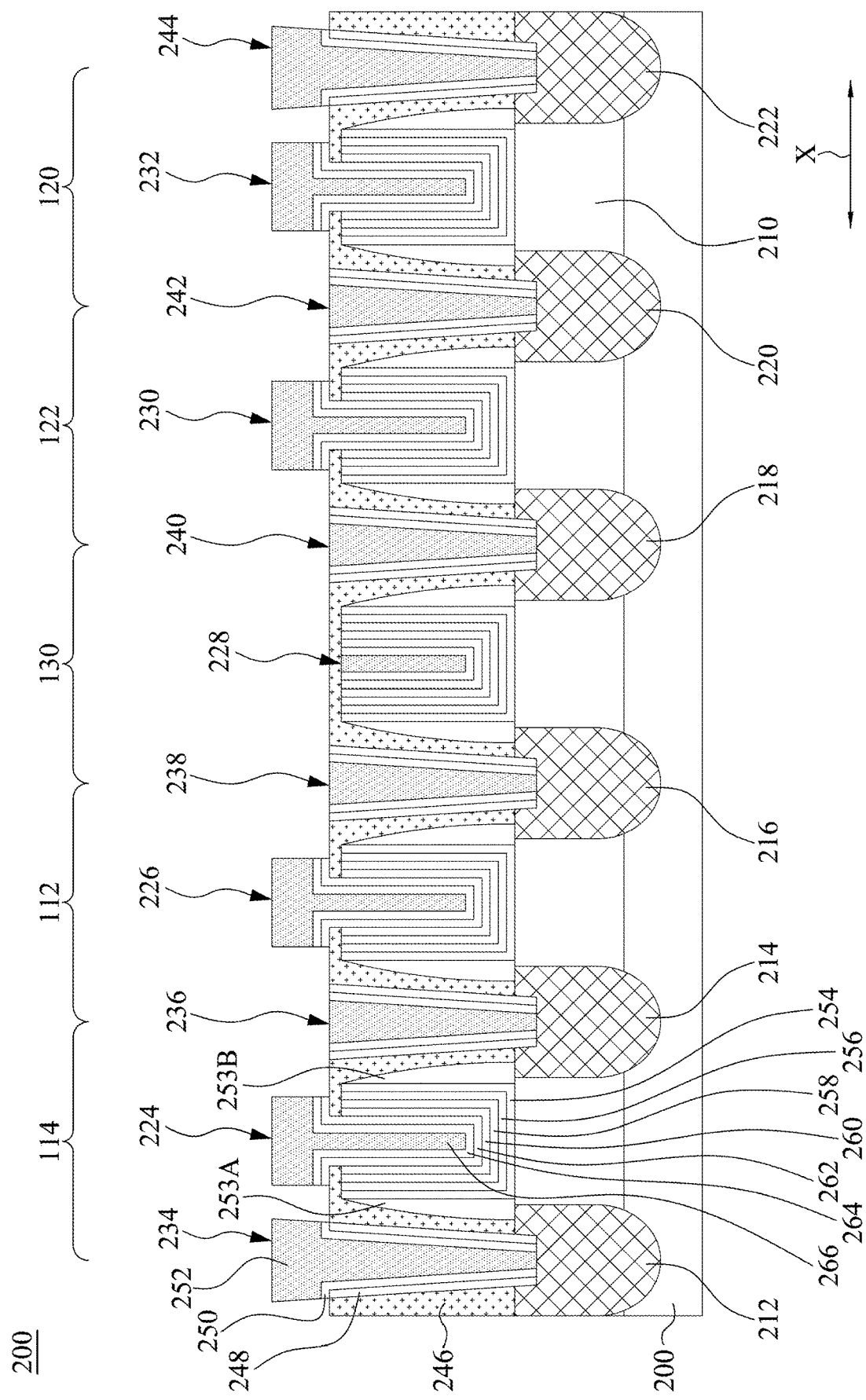
FIG. 2B is a cross-sectional view of a structure corresponding to a first memory unit, an isolation transistor, and a second memory unit of FIG. 2A.

FIG. 2A is an equivalent circuit diagram of a memory circuit 300A of a memory device 300 according to a second embodiment of the present disclosure. FIG. 2B is a cross-sectional view of a structure corresponding to a first memory unit 110, an isolation transistor 130, and a second memory unit 120 of FIG. 2A. Illustrated in FIG. 2A are two rows of transistors and five transistors in each row. However, it is acknowledged that the amount of rows and the amount of transistors in each row are only for clarity, not intended to limit the scope of the present disclosure. At least one difference between the present embodiment and the first embodiment is that the ILD layer 246 of the memory device 300 of the present embodiment may cover the gate structure 228 of the isolation transistor 130, so as to allow the fifth gate terminal G5 of the isolation transistor 130 to have a floating electrical potential.

As the fifth gate terminal G5 of the isolation transistor 130 has the floating electrical potential, the isolation transistor 130 is not conducted, thereby achieving that the second S/D terminal S2 of the first bipolar-variable-resistance transistor 112 and the third S/D terminal S3 of the second bipolar-variable-resistance transistor 122 are electrically isolated from each other. Accordingly, it can avoid leakage current generating between the first and second memory units 110 and 120. Explained in a different way, the flowing back of the sneak current from the second memory unit 120 to the first memory unit 110 in the same row is suppressed, as discussed previously. Many aspects of the memory device 300 can be the same as the memory device 100 (e.g., the operations), and thus the detailed explanation may be omitted.

Figure 3A:
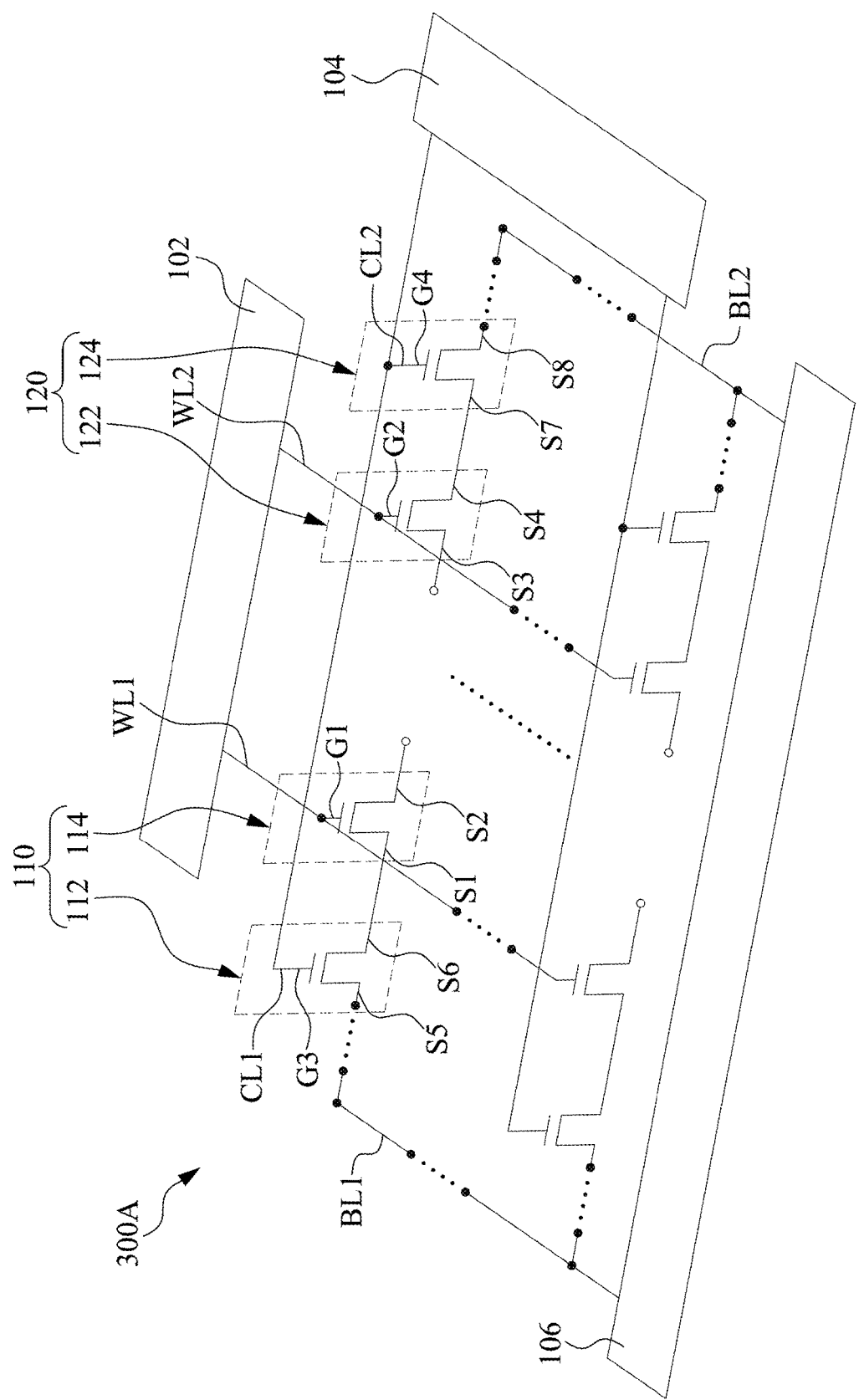
FIG. 3A is an equivalent circuit diagram of a memory circuit of a memory device according to a third embodiment of the present disclosure.
Figure 3B:
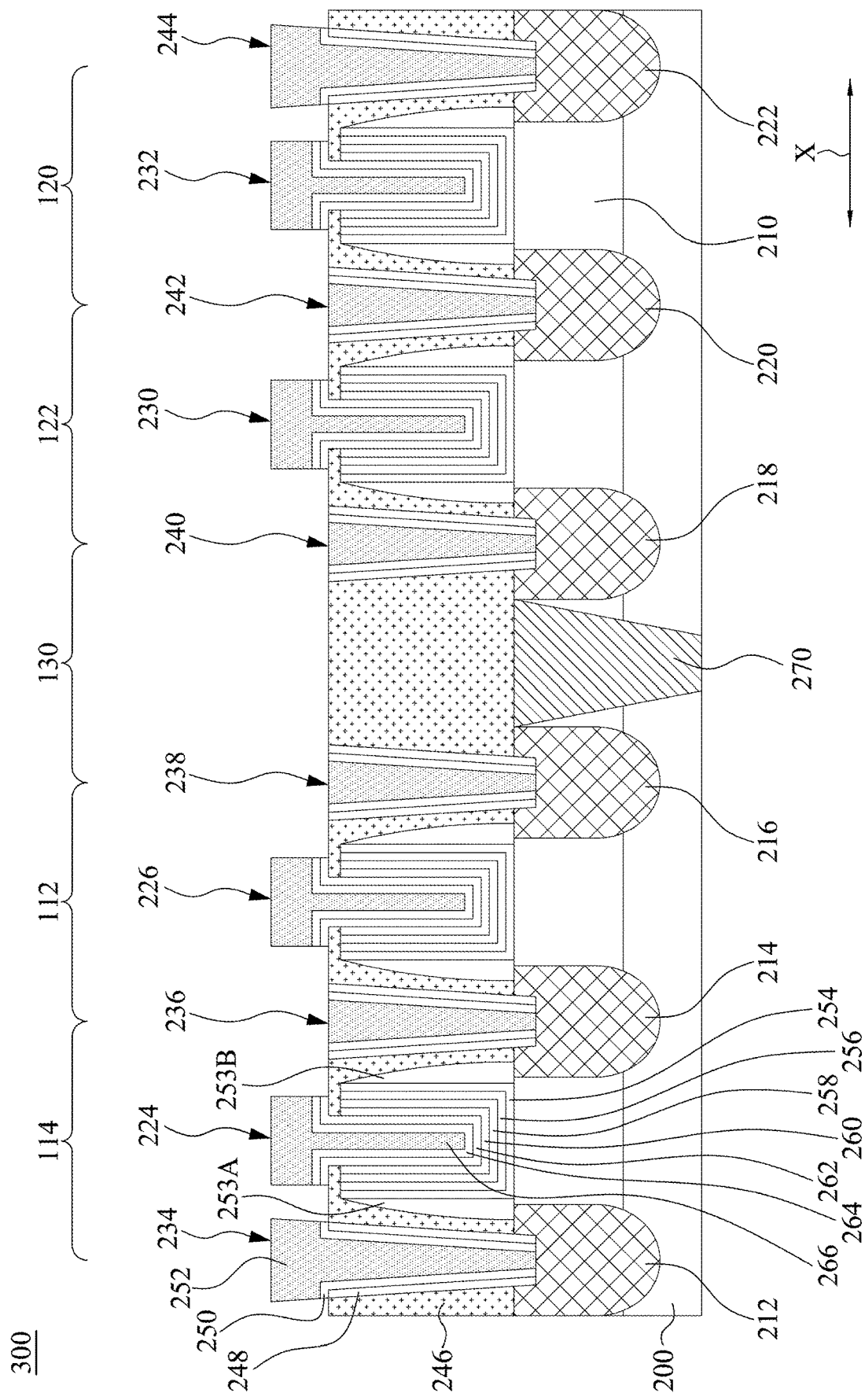
FIG. 3B is a cross-sectional view of a structure corresponding to a first memory unit, a dielectric isolation structure, and a second memory unit of FIG. 3A.

FIG. 3A is an equivalent circuit diagram of a memory circuit 400A of a memory device 400 according to a third embodiment of the present disclosure. FIG. 3B is a cross-sectional view of a structure corresponding to a first memory unit 110, a dielectric isolation structure 270, and a second memory unit 120 of FIG. 3A. Illustrated in FIG. 3A are two rows of transistors and four transistors in each row. However, it is acknowledged that the amount of rows and the amount of transistors in each row are only for clarity, not intended to limit the scope of the present disclosure. At least one difference between the present embodiment and the first embodiment is that the memory device 400 of the present embodiment further includes a dielectric isolation structure 270 arranged between the first and second bipolar-variable-resistance transistors 112 and 122.

The dielectric isolation structure 270 arranged between the first and second bipolar-variable-resistance transistors 112 and 122 can serve as an isolation region in the memory device 400, so as to electrically isolate the first and second bipolar-variable-resistance transistors 112 and 122 from each other. That is, the isolation transistor 130 (see FIG. 1B) can be replaced by the dielectric isolation structure 270, thereby avoid leakage current generating between the first and second memory units 110 and 120. Explained in a different way, flowing back of the sneak current from the second memory unit 120 to the first memory unit 110 in the same row is suppressed, as discussed previously. The dielectric isolation structure 270 can be referred to as a shallow trench isolation (STI) structure, the STI structure can be disposed in the substrate 200 and the fin structure 210 and covered by the ILD layer 246. Example materials of the dielectric isolation structure 270 includes isolation materials, such one or more than one layer made of $SiO_2$, $Si_3N_4$, SiON, SiOCN, fluorine-doped silicate glass (FSG), low-k dielectric material, or combinations thereof.

According to the aforementioned, the present disclosure provides the memory device includes the memory circuit, in which the memory circuit can be referred to as RRAM circuit by using the bipolar-variable-resistance transistors. The memory device includes the first memory unit, the second memory unit, and an electric isolation feature coupled between the first and second memory units. The first memory unit includes the first bipolar-variable-resistance transistor and the first control transistor, in which the first control transistor is configured to control if the first bipolar-variable-resistance transistor can conduct current. The second memory unit includes the second bipolar-variable-resistance transistor and the second control transistor, in which the second control transistor is configured to control if the second bipolar-variable-resistance transistor can conduct current. The first and second bipolar-variable-resistance transistor can be arranged as the HKMG structure. When the memory circuit performs the writing or reading operation, the electric isolation feature can be configured to electrically isolate the first and second memory units from each other, thereby preventing leakage current between the first and second memory units. For example, flowing back of the sneak current from one memory unit to another memory unit in the same row is suppressed, as discussed previously.

Furthermore, the gate structures of the first control transistor, the first bipolar-variable-resistance transistor, the isolation transistor, the second bipolar-variable-resistance transistor, and the second control transistor can be respectively arranged on the same fin structure. Accordingly, the formation of the first control transistor, the first bipolar-variable-resistance transistor, the isolation transistor, the second bipolar-variable-resistance transistor, and the second control transistor can be performed by the same process, thereby reducing the number of the masks used in the process and reducing the cost of the manufacturing process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of the present disclosure provided they fall within the scope of the following claims.

What is claimed is:

1. A nonvolatile memory, comprising:
a first memory unit comprising a first bipolar-variable-resistance transistor and a first control transistor which are electrically connected to each other, wherein the first bipolar-variable-resistance transistor is electrically connected to a word-line selecting driving circuit, the first control transistor is electrically connected to a control-line selecting driving circuit, and the first bipolar-variable-resistance transistor is configured to receive a first current flow from a bit-line selecting driving circuit through the first control transistor when the first control transistor is driven by the control-line selecting driving circuit;
a second memory unit comprising a second bipolar-variable-resistance transistor and a second control transistor which are electrically connected to each other, wherein the second bipolar-variable-resistance transistor is electrically connected to the word-line selecting driving circuit, the second control transistor is electrically connected to the control-line selecting driving circuit, and the second bipolar-variable-resistance transistor is configured to receive a second current flow from the bit-line selecting driving circuit through the second control transistor when the second control transistor is driven by the control-line selecting driving circuit; and
an isolation transistor coupled between the first and second memory units and configured to electrically isolate the first and second memory units from each other, wherein the isolation transistor has a gate terminal, a first terminal and a second terminal, the first terminal is directly coupled to the first bipolar-variable-resistance transistor, and the second terminal is directly coupled to the second bipolar-variable-resistance transistor, the gate terminal has a ground potential or a floating electrical potential such that the isolation transistor is always unconducted, wherein the isolation transistor consists of a single MOSFET.

2. The nonvolatile memory of claim 1, further comprising:
a fin structure extending along a direction, wherein the first control transistor, the first bipolar-variable-resistance transistor, the isolation transistor, the second bipolar-variable-resistance transistor, and the second control transistor respectively comprise gate structures arranged along the direction on the fin structure.

3. The nonvolatile memory of claim 1, wherein the isolation transistor comprises a gate structure, the nonvolatile memory further comprises an inter-layer dielectric (ILD) layer covering the gate structure of the isolation transistor, so as to allow the gate terminal of the isolation transistor to have the floating electrical potential.

4. A nonvolatile memory, comprising:
a first memory unit comprising a first bipolar-variable-resistance transistor and a first control transistor which are electrically connected to each other, wherein the first bipolar-variable-resistance transistor is electrically connected to a word-line selecting driving circuit, the first control transistor is electrically connected to a control-line selecting driving circuit, and the first bipolar-variable-resistance transistor is configured to receive a first current flow from a bit-line selecting driving circuit through the first control transistor when the first control transistor is driven by the control-line selecting driving circuit;
a second memory unit comprising a second bipolar-variable-resistance transistor and a second control transistor which are electrically connected to each other, wherein the second bipolar-variable-resistance transistor is electrically connected to the word-line selecting driving circuit, the second control transistor is electrically connected to the control-line selecting driving circuit, and the second bipolar-variable-resistance transistor is configured to receive a second current flow from the bit-line selecting driving circuit through the second control transistor when the second control transistor is driven by the control-line selecting driving circuit;
an isolation transistor arranged between the first and second bipolar-variable-resistance transistors and configured to electrically isolate the first and second memory units from each other, wherein a gate terminal of the isolation transistor has a floating potential such that the isolation transistor is always unconducted, wherein the isolation transistor consists of a single MOSFET; and
a fin structure extending along a direction, wherein the first control transistor, the first bipolar-variable-resistance transistor, the second bipolar-variable-resistance transistor, and the second control transistor respectively comprise gate structures arranged along the direction on the fin structure, and the isolation transistor is within the fin structure.

5. A nonvolatile memory, comprising:
a first bipolar-variable-resistance transistor having a first source/drain (S/D) terminal and a second S/D terminal;
a first control transistor electrically connected between a first bit line and the first S/D terminal of the first bipolar-variable-resistance transistor, wherein the first bipolar-variable-resistance transistor is electrically connected to the first bit line through the first control transistor;
a second bipolar-variable-resistance transistor having a third S/D terminal and a fourth S/D terminal;
a second control transistor electrically connected between a second bit line and the fourth S/D terminal of the second bipolar-variable-resistance transistor, wherein the second bipolar-variable-resistance transistor is electrically connected to the second bit line through the second control transistor; and
an isolation transistor coupled between the second S/D terminal of the first bipolar-variable-resistance transistor and the third S/D terminal of the second bipolar-variable-resistance transistor, wherein the isolation transistor has a first terminal and a second terminal, the first terminal is directly coupled to the second S/D terminal of the first bipolar-variable-resistance transistor, and the second terminal is directly coupled to the third S/D terminal of the second bipolar-variable-resistance transistor,
wherein a portion of the first bipolar-variable-resistance transistor between the first and second S/D terminals and a portion of the second bipolar-variable-resistance transistor between the third and fourth S/D terminals are channel regions,
wherein each of the first bipolar-variable-resistance transistor and the second bipolar-variable-resistance transistor further comprises a gate structure, each gate structure comprises a gate metal layer and a variable-resistance insulator stacking, the variable-resistance insulator stacking is formed between the gate metal layer and the channel regions, and the gate metal layer, the variable-resistance insulator stacking and the channel regions form a metal-insulator-semiconductor (MIS) structure, wherein the channel regions are semiconductive regions of a fin.

6. The nonvolatile memory of claim 5, wherein the first and second bit lines are electrically connected to a bit-line selecting driving circuit, the first bipolar-variable-resistance transistor has a first gate terminal, the second bipolar-variable-resistance transistor has a second gate terminal, and the nonvolatile memory further comprises:

a first word line configured to electrically connect the first gate terminal of the first bipolar-variable-resistance transistor with a word-line selecting driving circuit, wherein the resistance of the first bipolar-variable-resistance transistor has equivalent to or more than two stable states by voltage or current which is applied to the first bipolar-variable-resistance transistor by the bit-line selecting driving circuit and the word-line selecting driving circuit; and a second word line configured to electrically connect the second gate terminal of the second bipolar-variable-resistance transistor with the word-line selecting driving circuit, wherein the resistance of the second bipolar-variable-resistance transistor has equivalent to or more than two stable states by voltage or current which is applied to the second bipolar-variable-resistance transistor by the bit-line selecting driving circuit and the word-line selecting driving circuit.

7. The nonvolatile memory of claim 5, wherein the channel regions are configured to control at least one current flow to pass there through, wherein the gate structure of the first bipolar-variable-resistance transistor further comprises:

a pair of spacers, wherein the gate metal layer disposed between the spacers and on the channel region;

a high-k dielectric layer disposed between the spacers and between the channel region and the gate metal layer;

a semiconductor oxide layer disposed between the spacers and between the high-k dielectric layer and the channel region; and a barrier layer disposed between the spacers and between the high-k dielectric layer and the gate metal layer.

8. The nonvolatile memory of claim 5, further comprising:

a fin structure extending along a direction, wherein the isolation transistor comprises a gate structure, the gate structures of the first control transistor, the first bipolar-variable-resistance transistor, the isolation transistor, the second bipolar-variable-resistance transistor, and the second control transistor are respectively arranged along the direction on the fin structure.

9. The nonvolatile memory of claim 5, wherein the isolation transistor has a gate terminal electrically connected to a ground-line selecting driving circuit through a ground line.

10. The nonvolatile memory of claim 5, wherein the isolation transistor comprises a gate structure, the nonvolatile memory further comprises an inter-layer dielectric (ILD) layer covering the gate structure of the isolation transistor, so as to allow a gate terminal of the isolation transistor to have a floating electrical potential.

11. The nonvolatile memory of claim 5, wherein a S/D terminal of the first control transistor is directly coupled to the first S/D terminal of the first bipolar-variable-resistance transistor, and a S/D terminal of the second control transistor is directly coupled to the fourth S/D terminal of the second bipolar-variable-resistance transistor.

12. A method for operating a nonvolatile memory, comprising:

driving and conducting a first control transistor of a first memory unit through a first control line and a first bit line;

providing a first bipolar-variable-resistance transistor of the first memory unit with a first current flow from a bit-line selecting driving circuit through the first control transistor and the first bit line;

selecting the first bit line by the bit-line selecting driving circuit and selecting a first word line by a word-line selecting driving circuit to apply a bias to the first bipolar-variable-resistance transistor;

driving and conducting a second control transistor of a second memory unit through a second control line and a second bit line;

providing a second bipolar-variable-resistance transistor of the second memory unit with a second current flow from the bit-line selecting driving circuit through the second control transistor and the second bit line;

selecting the second bit line by the bit-line selecting driving circuit and selecting a second word line by the word-line selecting driving circuit to apply a bias to the second bipolar-variable-resistance transistor; and electrically isolating the first and second bipolar-variable-resistance transistors from each other by breaking a current path in a channel region of an isolation transistor which has a gate terminal has a ground potential or a floating electrical potential such that the isolation transistor is always unconducted, a first terminal directly coupled to the first bipolar-variable-resistance transistor and a second terminal directly coupled to the second bipolar-variable-resistance transistor, wherein the isolation transistor consists of a single MOSFET.

13. The method of claim 12, wherein applying the bias to the first bipolar-variable-resistance transistor further comprises:

applying the bias to gate dielectrics of the first bipolar-variable-resistance transistor, such that a resistance of the gate dielectrics of the first bipolar-variable-resistance transistor is varied.

14. The method of claim 12, further comprising:

applying a first bias to the first bipolar-variable-resistance transistor, so as to set a resistance of the first bipolar-variable-resistance transistor in a first state; and applying a second bias to the first bipolar-variable-resistance transistor, so as to change the resistance of the first bipolar-variable-resistance transistor from the first state into a second state.

15. The method of claim 14, further comprising:

selecting the first bit line by the bit-line selecting driving circuit and selecting the first word line by the word-line selecting driving circuit to generate a current passing through the first bipolar-variable-resistance transistor, wherein the resistance of the first bipolar-variable-resistance transistor is identified as being in the first state or the second state in response to the generated current.

* * * * *